(12) United States Patent
Hayashi

(10) Patent No.: US 11,930,589 B2
(45) Date of Patent: Mar. 12, 2024

(54) PRINTED WIRING BOARD AND METHOD FOR MANUFACTURING THE SAME

(71) Applicant: IBIDEN CO., LTD., Gifu (JP)

(72) Inventor: Yoshihiko Hayashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/467,925

(22) Filed: Sep. 7, 2021

(65) Prior Publication Data
US 2022/0078903 A1   Mar. 10, 2022

(30) Foreign Application Priority Data

Sep. 10, 2020   (JP) .................................. 2020-151726

(51) Int. Cl.
| | | |
|---|---|---|
| H05K 1/02 | (2006.01) | |
| G06K 19/06 | (2006.01) | |
| H05K 1/09 | (2006.01) | |
| H05K 1/11 | (2006.01) | |
| H05K 3/02 | (2006.01) | |

(52) U.S. Cl.
CPC ..... *H05K 1/0266* (2013.01); *G06K 19/06037* (2013.01); *H05K 1/09* (2013.01); *H05K 3/027* (2013.01); *H05K 1/11* (2013.01); *H05K 2203/107* (2013.01)

(58) Field of Classification Search
CPC ........ H05K 1/0266; H05K 1/09; H05K 3/027; H05K 2203/107; H05K 2201/09927; H05K 2203/0571; G06K 19/06037; G06K 19/02; G06K 19/06121; G06K 19/06159
See application file for complete search history.

(56) References Cited

U.S. PATENT DOCUMENTS

| | | | | |
|---|---|---|---|---|
| 5,768,107 | A * | 6/1998 | Ouchi .................. | H05K 1/0269 361/792 |
| 6,594,153 | B1 * | 7/2003 | Zu ..................... | H01L 23/49833 174/250 |
| 7,884,472 | B2 * | 2/2011 | Chen ................. | H01L 21/67294 257/737 |

(Continued)

FOREIGN PATENT DOCUMENTS

JP   2016-103587 A   6/2016

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a lower layer including conductor layers and insulating layers, a conductor layer formed on the outermost insulating layer in the lower layer, and a solder resist layer formed on the conductor layer such that the solder resist layer is covering the conductor layer on the outermost insulating layer, and a two-dimensional code structure formed on the lower layer and including the conductor layer and a portion of the solder resist layer such that the portion of the solder resist layer has openings forming exposed portions of the conductor layer and that the openings of the solder resist layer and the exposed portions of the conductor layer form the two-dimensional code structure. The conductor layer includes a portion corresponding to the two-dimensional code structure such that the portion of the conductor layer has a residual copper rate that allows the two-dimensional code structure to be read.

20 Claims, 4 Drawing Sheets

(56) References Cited

U.S. PATENT DOCUMENTS

| | | | |
|---|---|---|---|
| 2016/0005665 A1* | 1/2016 | Suzuki | H01L 24/97 |
| | | | 438/15 |
| 2016/0055403 A1* | 2/2016 | Chou | G06K 1/12 |
| | | | 235/494 |
| 2016/0172307 A1* | 6/2016 | Suzuki | H01L 21/561 |
| | | | 438/112 |
| 2016/0224811 A1* | 8/2016 | Kawashima | H05K 1/0268 |

* cited by examiner

PRIOR ART

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2020-151726, filed Sep. 10, 2020, the entire contents of which are incorporated herein by reference.

BACKGROUND OF THE INVENTION

Field of the Invention

The present invention relates to a printed wiring board having a two-dimensional code for substrate recognition and relates to a method for manufacturing the printed wiring board.

Description of Background Art

Japanese Patent Application Laid-Open Publication No. 2016-103587 describes a printed wiring board having a two-dimensional code. The entire contents of this publication are incorporated herein by reference.

SUMMARY OF THE INVENTION

According to one aspect of the present invention, a printed wiring board includes a lower layer including conductor layers and insulating layers, a conductor layer formed on the outermost insulating layer of the insulating layers in the lower layer, and a solder resist layer formed on the conductor layer such that the solder resist layer is covering the conductor layer formed on the outermost insulating layer of the lower layer, and a two-dimensional code structure formed on the lower layer and including the conductor layer and a portion of the solder resist layer such that the portion of the solder resist layer has openings forming exposed portions of the conductor layer and that the openings of the solder resist layer and the exposed portions of the conductor layer form the two-dimensional code structure. The conductor layer includes a portion corresponding to the two-dimensional code structure such that the portion of the conductor layer has a residual copper rate that allows the two-dimensional code structure to be read, where the residual copper rate is a rate of an area with a degas pattern/an area without a degas pattern in the portion of conductor layer.

According to another aspect of the present invention, a method for manufacturing a printed wiring board includes forming a lower layer including conductor layers and insulating layers, forming a conductor layer on the outermost insulating layer of the insulating layer in the lower layer, forming a solder resist layer on the conductor layer such that the solder resist layer covers the conductor layer formed on the outermost insulating layer of the lower layer, and forming a two-dimensional code on the lower layer including the conductor layer and a portion of the solder resist layer such that the portion of the solder resist layer has openings forming exposed portions of the conductor layer and that the openings of the solder resist layer and the exposed portions of the conductor layer form the two-dimensional code structure. The conductor layer includes a portion corresponding to the two-dimensional code structure such that the portion of the conductor layer has a residual copper rate that allows the two-dimensional code structure to be read, where the residual copper rate is a rate of an area with a degas pattern/an area without a degas pattern in the portion of conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
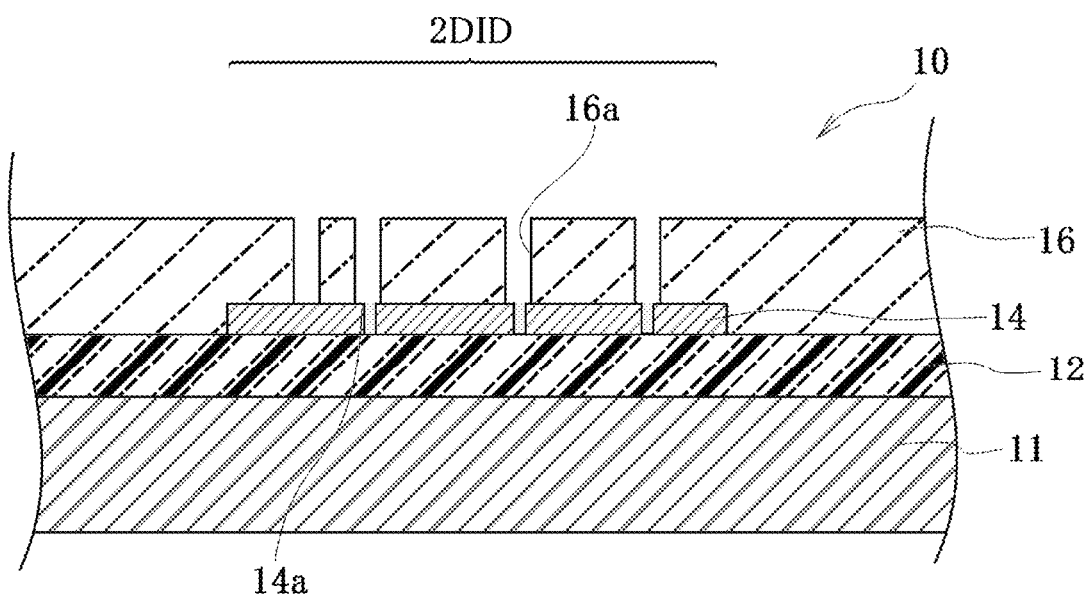
FIG. 1 is a cross-sectional view for describing a printed wiring board having a two-dimensional code according to an embodiment of the present invention.

Embodiments will now be described with reference to the accompanying drawings, wherein like reference numerals designate corresponding or identical elements throughout the various drawings.

FIG. 1 illustrates an enlarged view of a portion of a printed wiring board 10 of the embodiment having a two-dimensional code (2DID). The printed wiring board 10 may be a substrate with a core having a lower layer formed by alternately laminating conductor layers and resin insulating layers on one side or both sides of a core substrate (not illustrated in the drawings), the conductor layers each having a predetermined circuit pattern. When the conductor layers are formed on both sides of the core substrate, conductor layers opposing each other via the core substrate may be connected to each other via through-hole conductors (not illustrated in the drawings). Or, the printed wiring board 10 may be a coreless substrate obtained by alternately laminating conductor layers and insulating layers on a support plate (not illustrated in the drawings) instead of a core substrate and then removing the support plate.

In any case, as illustrated in FIG. 1, the printed wiring board 10 having the two-dimensional code (2DID) includes: a lower layer 11 in which multiple conductor layers and multiple insulating layers are alternately provided; a conductor layer 14 formed on an outermost insulating layer 12 of the lower layer 11; and a solder resist layer 16 formed on the conductor layer 14. Then, the two-dimensional code (2DID) is formed by the solder resist layer 16 and the conductor layer (14a) exposed through an opening or openings (16a) of the solder resist layer 16.

Figure 2:
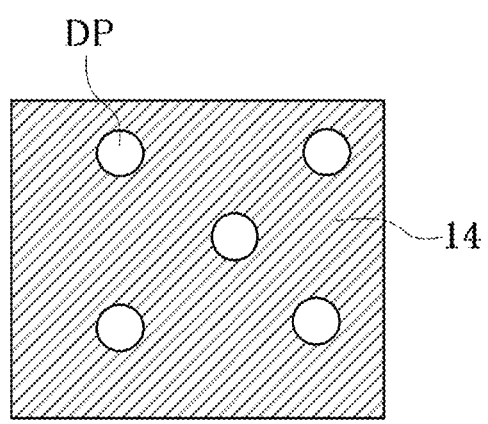
FIG. 2 is for describing a degas pattern in a printed wiring board according to an embodiment of the present invention.

A feature of the printed wiring board 10 according to an embodiment of the present invention is that the conductor layer 14 positioned under the two-dimensional code (2DID) has a residual copper rate that allows the two-dimensional code (2DID) to be read. Here, "a residual copper rate that allows the two-dimensional code (2DID) to be read" means a residual copper rate that is not reflected in the two-dimensional code through the opening or openings (16a) of the solder resist layer 16 in which a degas pattern (degassing holes) existing in the conductor layer 14 as shown in FIG. 2 is exposed. Further, as illustrated in FIG. 2, the "residual copper rate" means (an area with a degas pattern)/(an area without a degas pattern) when the conductor layer 14 corresponding to the two-dimensional code is viewed from above.

In the printed wiring board 10 according to an embodiment of the present invention, a preferable range of the "remaining copper rate that allows the two-dimensional code (2DID) to be read" is 80% or more in the conductor layer 14 as a lower layer of the two-dimensional code. When the residual copper rate is less than 80%, it is possible that the two-dimensional code cannot be read. Therefore, the residual copper rate of the conductor layer 14 is preferably in the range of 80% or more.

In the printed wiring board according to an embodiment of the present invention having the above-described structure, in the conductor layer 14 as a lower layer corresponding to the two-dimensional pattern, a ratio of the degas pattern can be reduced, and reflection of the degas pattern in the two-dimensional pattern can be eliminated.

Figure 3:
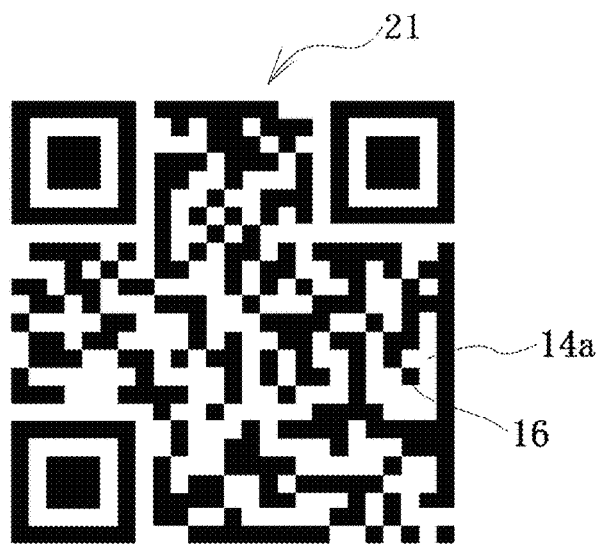
FIG. 3 describes a structure of a two-dimensional code in a printed wiring board according to an embodiment of the present invention.

FIG. 3 is for describing a structure of the two-dimensional code in a printed wiring board according to an embodiment of the present invention. In the example illustrated in FIG. 3, a QR code (registered trademark) 21 is illustrated as an example of the two-dimensional code. The QR code (registered trademark) 21 is formed of a combination of white cells and black cells, and is defined in JIS X 0510:2004. In an embodiment of the present invention, as illustrated in FIG. 3, the black cell portion is formed from the solder resist layer 16, and the white cell portion is formed from the conductor layer (14a of the conductor layer 14) exposed from the solder resist layer 16.

The two-dimensional code illustrated in FIG. 3 is used as a product recognition code, a manufacture recognition code, and a process recognition code. Here, the product recognition code means a code that can determine or distinguish a company name, a product name, product characteristics, and the like. The manufacture recognition code means a code that can determine or distinguish a manufacturing date, a control number, a lot number, data or results related to manufacturing based on inspection results or the like (in processes before the formation of the code). The process recognition code means a code for recognition related to a process such as mounting, product recognition in an inspection process, or recognition of an alignment target.

Figure 4:
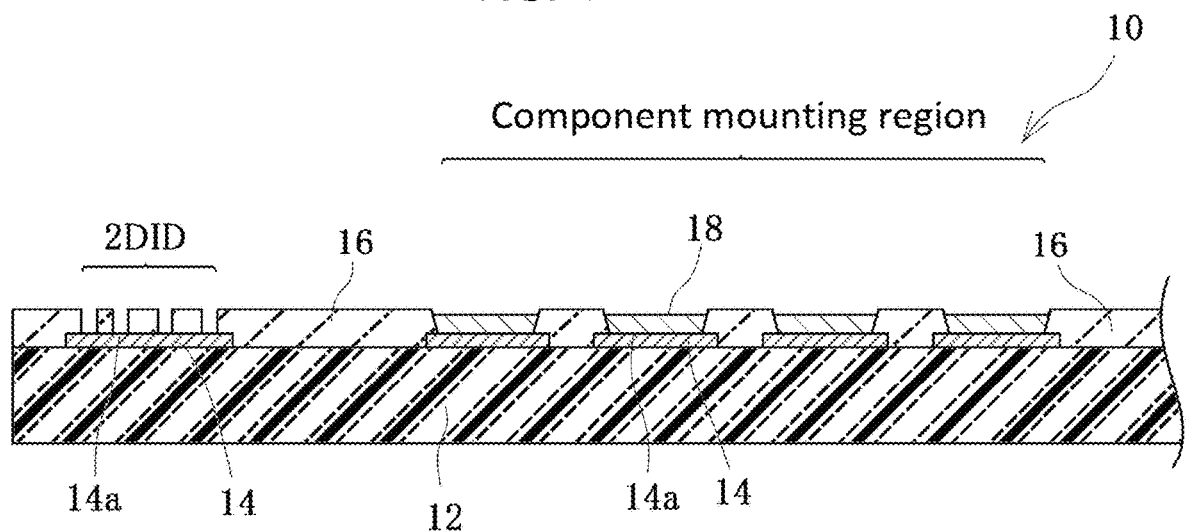
FIG. 4 is a cross-sectional view describing a formation position of a two-dimensional code of a printed wiring board according to an embodiment of the present invention.

FIG. 4 is a cross-sectional view for describing a formation position of the two-dimensional code of a printed wiring board according to an embodiment of the present invention. In the example illustrated in FIG. 4, the two-dimensional code (2DID), which is formed by the solder resist layer 16 and the conductor layer (14a) exposed through the openings (16a) of the solder resist layer 16, exists in a peripheral region, here at an outermost edge part, of the printed wiring board 10. In this example, when component mounting is performed from the state illustrated in FIG. 4, for example, by forming bumps on the conductor layer 14 existing in a component mounting region where the two-dimensional code is not present, the two-dimensional code in the peripheral region of the printed wiring board 10 can be read, and information such a lot of the printed wiring board 10 can be used for the component mounting.

Figure 5A:
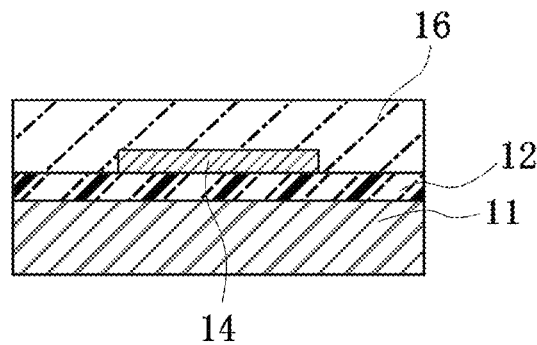
FIGS. 5A-5C are cross-sectional views describing a method for manufacturing a printed wiring board according to an embodiment of the present invention.
Figure 5B:
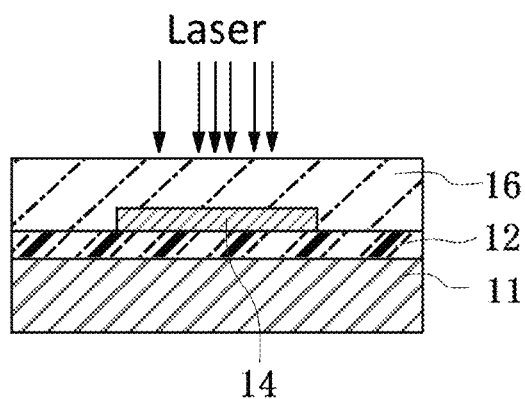
Figure 5C:
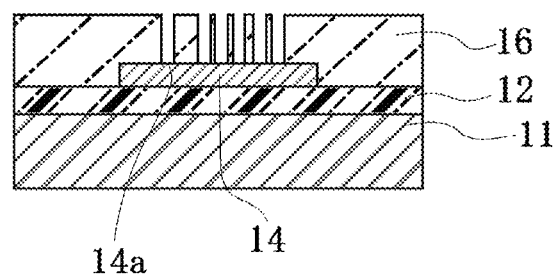

Next, a method for manufacturing a printed wiring board according to an embodiment of the present invention is described with reference to FIGS. 5A-5C. In order to obtain the printed wiring board 10 illustrated in FIG. 4, a known method is used, and the conductor layer 14 (a 2DID portion of which is a solid pattern), which has a predetermined circuit pattern, and the solder resist layer 16 are formed on the outermost insulating layer 12 of the lower layer 11 (FIG. 5A). Next, laser processing is applied to the solder resist layer 16 at a predetermined position (FIG. 5B), and the two-dimensional code formed of the solder resist layer 16 and the conductor layer (14a) exposed through the opening or openings (16a) of the solder resist layer 16 is formed (FIG. 5C). The laser processing can be performed under known conditions. As an example, the laser processing can be performed by irradiating $CO_2$ laser to a surface of the solder resist layer 16 according to a pattern of the two-dimensional code.

When mounting a high-density IC with a large number of IC connection terminals, an optimum mounting condition is individually grasped based on information such as a substrate-side bump height. Therefore, a two-dimensional code containing information such as a product thickness and a warpage shape required for mounting is assigned to each individual printed wiring board (see, for example, Japanese Patent Application Laid-Open Publication No. 2016-103587).

Figure 6:
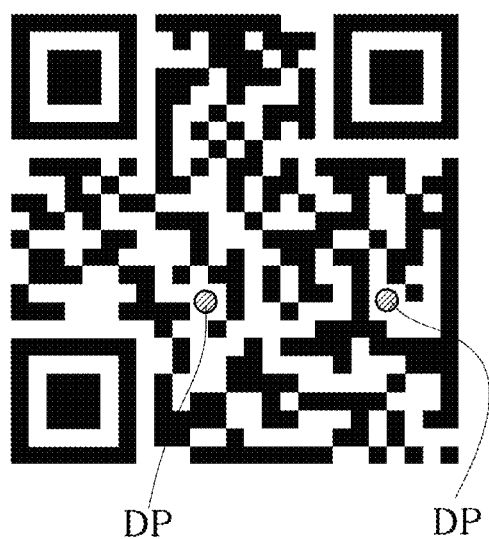
FIG. 6 describes a problem of a conventional printed wiring board having a two-dimensional code.

In a reader that reads the two-dimensional code, ring lighting is used for lighting. Therefore, when the two-dimensional code (here a QR code (registered trademark)) is read, as illustrated in FIG. 6, a degas pattern (DP) of a lower layer on a lower side of the two-dimensional code is transparent and is reflected in the two-dimensional code, causing a reading error of the two-dimensional code.

A printed wiring board according to an embodiment of the present invention includes: a lower layer in which multiple conductor layers and multiple insulating layers are alternately provided; a conductor layer that is formed on an outermost insulating layer of the lower layer; a solder resist layer that is formed on the conductor layer; and a two-dimensional code that is formed of the solder resist layer and the conductor layer exposed through an opening or openings of the solder resist layer. The conductor layer positioned on a lower side of the two-dimensional code has a residual copper rate that allows the two-dimensional code to be read.

A method for manufacturing a printed wiring board according to an embodiment of the present invention includes: forming a lower layer in which multiple conductor layers and multiple insulating layers are alternately provided; forming a conductor layer on an outermost insulating layer of the lower layer; forming a solder resist layer on the conductor layer; and forming a two-dimensional code that is formed of the solder resist layer and the conductor layer exposed through an opening or openings of the solder resist layer. The two-dimensional code is formed on a region where the conductor layer has a residual copper rate that allows the two-dimensional code to be read.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a lower layer comprising a plurality of conductor layers and a plurality of insulating layers;

a conductor layer formed on an outermost insulating layer of the plurality of insulating layers in the lower layer; and a solder resist layer formed on the conductor layer such that the solder resist layer is covering the conductor layer formed on the outermost insulating layer of the lower layer; and a two-dimensional code structure formed on the lower layer and comprising the conductor layer and a portion of the solder resist layer such that the portion of the solder resist layer has a plurality of openings forming a plurality of exposed portions of the conductor layer and that the plurality of openings of the solder resist layer and the plurality of exposed portions of the conductor layer form the two-dimensional code structure, wherein the conductor layer includes a portion corresponding to the two-dimensional code structure such that the conductor layer has a degas pattern comprising a plurality of degassing holes and formed in the plurality of exposed portions of the conductor layer and that the portion of the conductor layer has a residual copper rate that is 80% or more and allows the two-dimensional code structure be read, where the residual copper rate is a rate of an area with the degas pattern/an area without the degas pattern in the portion of conductor layer.

2. The printed wiring board according to claim 1, wherein the lower layer is formed such that the conductor layers and the insulating layers are alternately laminated.

3. The printed wiring board according to claim 2, wherein the two-dimensional code structure is formed in a peripheral region of the lower layer.

4. The printed wiring board according to claim 2, wherein the two-dimensional code structure is at least one of a product recognition code, a manufacture recognition code, and a process recognition code.

5. The printed wiring board according to claim 2, wherein the two-dimensional code structure is a product recognition code.

6. The printed wiring board according to claim 2, wherein the two-dimensional code structure is a manufacture recognition code.

7. The printed wiring board according to claim 2, wherein the two-dimensional code structure is a process recognition code.

8. The printed wiring board according to claim 1, wherein the two-dimensional code structure is formed in a peripheral region of the lower layer.

9. The printed wiring board according to claim 8, wherein the two-dimensional code structure is at least one of a product recognition code, a manufacture recognition code, and a process recognition code.

10. The printed wiring board according to claim 8, wherein the two-dimensional code structure is a product recognition code.

11. The printed wiring board according to claim 8, wherein the two-dimensional code structure is a manufacture recognition code.

12. The printed wiring board according to claim 8, wherein the two-dimensional code structure is a process recognition code.

13. The printed wiring board according to claim 1, wherein the two-dimensional code structure is at least one of a product recognition code, a manufacture recognition code, and a process recognition code.

14. The printed wiring board according to claim 1, wherein the two-dimensional code structure is a product recognition code.

15. The printed wiring board according to claim 1, wherein the two-dimensional code structure is a manufacture recognition code.

16. The printed wiring board according to claim 1, wherein the two-dimensional code structure is a process recognition code.

17. The printed wiring board according to claim 1, wherein the lower layer is formed such that each of the conductor layers has a circuit pattern.

18. A method for manufacturing a printed wiring board, comprising:

forming a lower layer comprising a plurality of conductor layers and a plurality of insulating layers;

forming a conductor layer on an outermost insulating layer of the plurality of insulating layer in the lower layer;

forming a solder resist layer on the conductor layer such that the solder resist layer covers the conductor layer formed on the outermost insulating layer of the lower layer; and forming a two-dimensional code on the lower layer comprising the conductor layer and a portion of the solder resist layer such that the portion of the solder resist layer has a plurality of openings forming a plurality of exposed portions of the conductor layer and that the plurality of openings of the solder resist layer and the plurality of exposed portions of the conductor layer form the two-dimensional code structure, wherein the conductor layer includes a portion corresponding to the two-dimensional code structure such that the conductor layer has a degas pattern comprising a plurality of degassing holes and formed in the plurality of exposed portions of the conductor layer and that the portion of the conductor layer has a residual copper rate that is 80% or more and allows the two-dimensional code structure to be read, where the residual copper rate is a rate of an area with the degas pattern/an area without the degas pattern in the portion of conductor layer.

19. The method for manufacturing a printed wiring board according to claim 18, wherein the lower layer is formed such that the conductor layers and the insulating layers are alternately laminated.

20. The method for manufacturing a printed wiring board according to claim 18, wherein the two-dimensional code structure is formed a peripheral region of the lower layer.

* * * * *